(12) United States Patent
Taguchi

(10) Patent No.: US 11,037,866 B2
(45) Date of Patent: Jun. 15, 2021

(54) SEMICONDUCTOR DEVICE AND METHOD OF MANUFACTURING THE SAME

(71) Applicant: ABLIC Inc., Chiba (JP)

(72) Inventor: Yasuhiro Taguchi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/428,149

(22) Filed: May 31, 2019

(65) Prior Publication Data
US 2019/0371713 A1 Dec. 5, 2019

(30) Foreign Application Priority Data

Jun. 1, 2018 (JP) .............................. JP2018-106049

(51) Int. Cl.
H01L 23/31 (2006.01)
H01L 23/495 (2006.01)
H01L 21/48 (2006.01)
H01L 23/00 (2006.01)

(52) U.S. Cl.
CPC .... *H01L 23/49555* (2013.01); *H01L 21/4842* (2013.01); *H01L 23/315* (2013.01); *H01L 23/49575* (2013.01); *H01L 24/49* (2013.01)

(58) Field of Classification Search
CPC ...... H01L 23/28; H01L 23/31; H01L 23/3135
See application file for complete search history.

(56) References Cited

U.S. PATENT DOCUMENTS

| 2008/0073759 A1* | 3/2008 | Youn | H01L 23/3107 |
| | | | 257/666 |
| 2010/0123237 A1* | 5/2010 | Han | H01L 25/105 |
| | | | 257/686 |
| 2013/0082405 A1* | 4/2013 | Chun | H01L 23/49575 |
| | | | 257/778 |

FOREIGN PATENT DOCUMENTS

JP H 02-126655 A 5/1990

* cited by examiner

*Primary Examiner* — Jae Lee
(74) *Attorney, Agent, or Firm* — Brinks Gilson & Lione

(57) ABSTRACT

A semiconductor device has inner leads (2a) of leads (2) which are covered with a first resin-encapsulating body (4), and has outer leads (2b) which are exposed from the first resin-encapsulating body (4), and which are given a shape bending downward and have distal ends having the bending shape extending in a lateral direction. The inner leads (2a) embedded in the first resin-encapsulating body (4) extend inward, and are then formed into a shape bending downward. Above end portions (3) having the bending shape, an element mounting portion (11) is formed of the first resin-encapsulating body (4), and a semiconductor element (6) placed on the element mounting portion (11) is covered with a second resin-encapsulating body (8).

16 Claims, 16 Drawing Sheets to the semiconductor element; outer leads which extend from the inner leads; and a second resin-encapsulating body which covers an upper surface of the first resin-encapsulating body and the semiconductor element, the inner leads being covered with the first resin-encapsulating body, upper surfaces of end portions of the inner leads locating below the element mounting portion.

SEMICONDUCTOR DEVICE AND METHOD OF MANUFACTURING THE SAME

RELATED APPLICATIONS

Priority is claimed on Japanese Patent Application No. 2018-106049, filed on Jun. 1, 2018, the content of which is incorporated herein by reference.

BACKGROUND OF THE INVENTION

1. Field of the Invention

The present invention relates to a compact semiconductor device and a method of manufacturing the same.

2. Description of the Related Art

In FIG. 16A to FIG. 16D, a conventional semiconductor device is illustrated. FIG. 16A is a bird's-eye view, FIG. 16B is a side view, FIG. 16C is a perspective plan view, and FIG. 16D is a cross-sectional view taken along the line M-M of FIG. 16C. A metal island 110 on which a semiconductor element 106 is mounted is connected to suspension leads 109 extending from a frame portion of a lead frame, and a plurality of inner leads 102a are arranged around the metal island 110. The semiconductor element 106 is bonded on the metal island 110 by a die attaching agent 105, and the plurality of inner leads 102a are electrically connected to the semiconductor element 106 by a plurality of wires 107. Then, the metal island 110, the semiconductor element 106, the die attaching agent 105, and the wires 107 are encapsulated by an encapsulating resin 104, and a plurality of outer leads 102b extending from the inner leads 102a to the outside of the encapsulating resin 104 has distal ends bending downward. Such a semiconductor package is generally called a "gull wing type semiconductor package."

In a conventional gull wing type semiconductor package, when thermal stress is applied at the time of board mounting, there have been problems in that displacements are caused at interfaces among the materials by a difference in thermal expansion coefficient, and cracks in a semiconductor element and stress applied on the semiconductor element may cause variations in characteristics since the semiconductor element 106, the metal island 110, and the encapsulating resin 104 are each made of different materials.

In order to solve the above-mentioned problems, there has been proposed a semiconductor device in which a semiconductor element is mounted on a resin die pad capable of reducing stress applied on the semiconductor element (see Japanese Patent Application Laid-open No. H2-126655, for example).

However, in fixation of the leads in a mold resin or a resin-made die pad, if a fixing area is small, there is a risk in that the leads may drop off the mold resin or the resin-made die pad due to the effect of ultrasonic vibration and heat at the time of wire bonding. There is also a concern of up-sizing of the semiconductor device caused by increase in the fixing area to avoid the drop off.

SUMMARY OF THE INVENTION

In the present invention a compact semiconductor device with less variations in characteristics is provided.

According to one aspect of the present invention there is provided a semiconductor device, including: a first resin-encapsulating body; an element mounting portion formed on a surface of the first resin-encapsulating body; a semiconductor element placed on the element mounting portion; inner leads which are provided around the element mounting portion, and are electrically connected to the semiconductor element; outer leads which extend from the inner leads; and a second resin-encapsulating body which covers an upper surface of the first resin-encapsulating body and the semiconductor element, the inner leads being covered with the first resin-encapsulating body, upper surfaces of end portions of the inner leads locating below the element mounting portion.

According to another aspect of the present invention there is provided a method of manufacturing a semiconductor device, the method including: preparing a lead frame having leads connected to a frame portion; bending end portions of the leads downward; forming a first resin-encapsulating body within the frame portion of the lead frame to cover the end portions with the first resin-encapsulating body, and expose an upper surfaces of other portions than the end portions of the leads from the first resin-encapsulating body; fixing a semiconductor element on an element mounting portion formed above the end portions; electrically connecting electrode portions of the semiconductor element to the upper surfaces of the other portions; covering the semiconductor element with a second resin-encapsulating body; removing thin regions of the first resin-encapsulating body; and cutting the other portions away from the frame portion to form outer leads.

According to yet another aspect of the present invention there is provided a method of manufacturing a semiconductor device, the method including: preparing a lead frame having leads and the resin holding leads connected to a frame portion; bending end portions of the leads and the resin holding leads downward; forming a first resin-encapsulating body within the frame portion of the lead frame to cover the end portions with the first resin-encapsulating body, and expose other portions than the end portions of the leads from the first resin-encapsulating body; fixing a semiconductor element on an element mounting portion formed above the end portions; electrically connecting electrode portions of the semiconductor element to the upper surface of the other portions; covering the semiconductor element with a second resin-encapsulating body; removing thin regions of the first resin-encapsulating body; cutting the other portions away from the frame portion to form outer leads; and cutting the resin holding leads away from the frame portion.

With the use of the above-mentioned measures, a compact semiconductor device with less variations in characteristics can be provided.

DETAILED DESCRIPTION OF THE PREFERRED EMBODIMENTS

Figure 1:
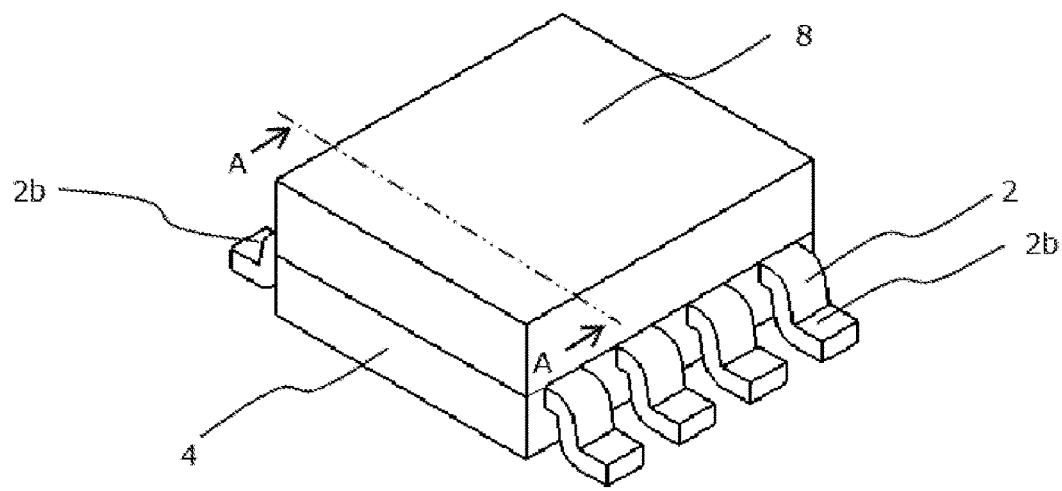
FIG. 1 is a bird's-eye view of a semiconductor device according to the first embodiment of the present invention.

In the following, a semiconductor device according to each embodiment of the present invention is described with reference to the drawings FIG. 1 is a bird's-eye view of a semiconductor device according to the first embodiment of the present invention.

As illustrated in FIG. 1, the semiconductor device has a configuration in which a semiconductor element is covered with a first resin-encapsulating body 4 and a second resin-encapsulating body 8, and in which outer leads 2b which are part of leads 2 are exposed from the first resin-encapsulating body 4. Upper surfaces of the leads 2 are flush with an upper surface of the first resin-encapsulating body 4 and are brought into contact with a lower surface of the second resin-encapsulating body 8.

Figure 2A:
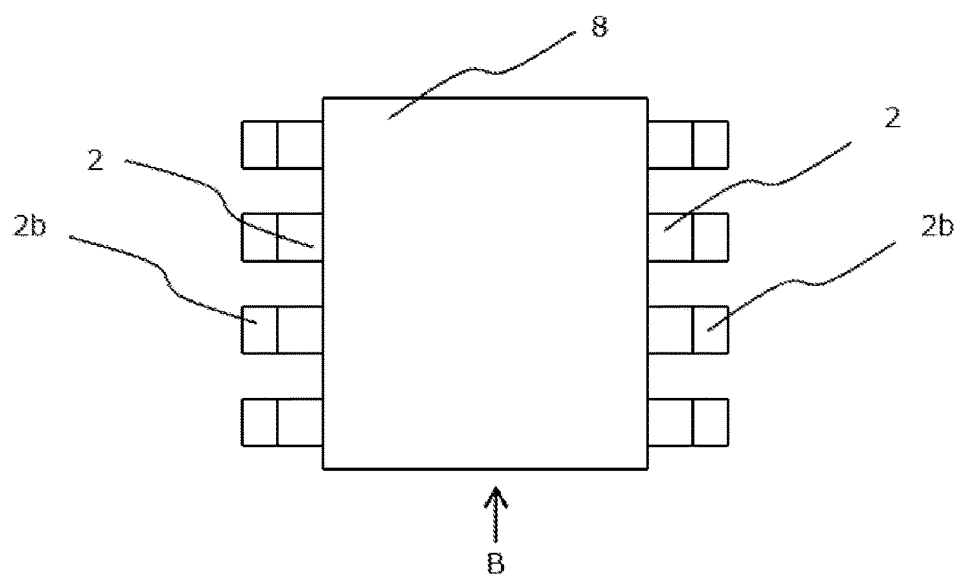
FIG. 2A, FIG. 2B, and FIG. 2C are views from respective directions of the semiconductor device according to the first embodiment of the present invention.
Figure 2B:
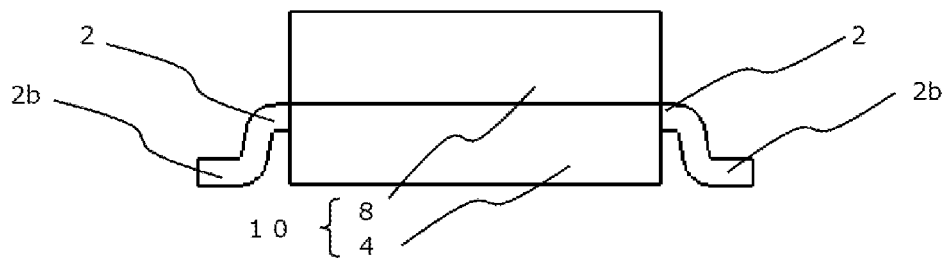
Figure 2C:
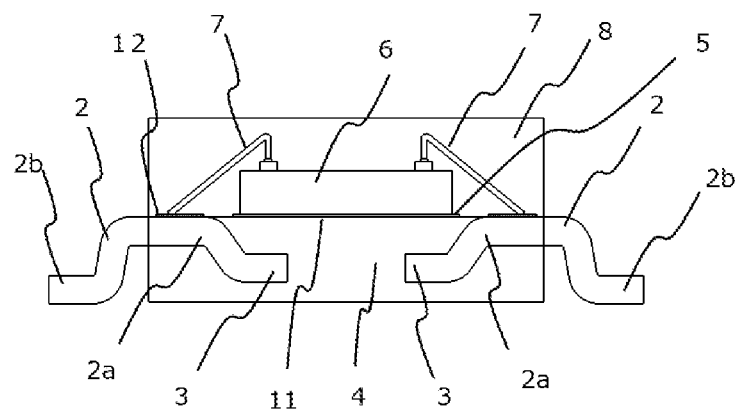

FIG. 2A to FIG. 2C are views from respective directions obtained from the bird's-eye view of FIG. 1. As illustrated in a top plan view of FIG. 2A, four outer leads 2b are provided to each of two opposing side surfaces of the semiconductor device. A view as seen in a direction indicated by the arrow B of a side surface adjacent to the two opposing side surfaces is FIG. 2B. The second resin-encapsulating body 8 is formed on the upper surface of the first resin-encapsulating body 4 with side surfaces of the first resin-encapsulating body 4 and the second resin-encapsulating body 8 being substantially flush with each other to form an integrated resin-encapsulating body 10 having substantially a rectangular parallelepiped shape.

The outer leads 2b of the leads 2 are exposed from the first resin-encapsulating body 4, and bottom surfaces of the bending outer leads 2b form mounting surfaces at the time of board mounting. FIG. 2C is a cross-sectional view taken along the line A-A of FIG. 1. Inner leads 2a of the leads 2 are covered with the first resin-encapsulating body 4, and the outer leads 2b are exposed from the first resin-encapsulating body 4 and given a shape bending downward and have distal ends having the bending shape extending in a lateral direction.

Each of the inner leads 2a is embedded in the first resin-encapsulating body 4 but the surface of a portion of the inner lead 2a that is close to the outer lead 2b is exposed from the first resin-encapsulating body 4 to join to one end of a wire 7 by a plated film 12 formed in the exposed region. The inner lead 2a embedded in the first resin-encapsulating body 4 extends inward, and is then formed into a shape bending downward. Upper and lower surfaces of the end portion 3 having the bending shape are covered with the first resin-encapsulating body 4 securing a sufficient thickness, to thereby strengthen close adhesion with the first resin-encapsulating body 4.

On a surface of the first resin-encapsulating body 4 that is above the end portions 3 of the inner leads 2a having the bending shape which are spaced apart and opposed, an element mounting portion 11 is formed, and a semiconductor element 6 is fixed thereto by a die attaching agent 5. On a surface of the semiconductor element 6, electrode portions are formed, and each electrode portion is joined to the other end of the wire 7, to thereby electrically join the semiconductor element 6 and the inner leads 2a. Moreover, the semiconductor element 6, the wires 7, the inner leads 2a, and the upper surface of the first resin-encapsulating body 4 are covered with the second resin-encapsulating body 8. The side surfaces of the first resin-encapsulating body 4 and the second resin-encapsulating body 8 are substantially flush with each other.

Since the element mounting portion 11 of the semiconductor device described above is formed in a planar region of the upper surface of the first resin-encapsulating body 4, and since the end portions 3 of the inner leads 2a having the bending shape is provided below the element mounting portion 11, an area of contact between the inner leads 2a and the first resin-encapsulating body 4 is very large to strengthen the close adhesion with each other. In the conventional semiconductor device, in order to strengthen the close adhesion with each other, it has been required to provide large fixation regions between the inner leads and the resin-encapsulating body around the element mounting portion, which renders downsizing of the semiconductor device. With the structure of the present invention, a compact semiconductor device can be achieved.

Further, the semiconductor element 6 is placed on the planar region of the upper surface of the first resin-encapsulating body 4 after resin molding, and hence is not affected by stress applied at the time of resin molding of the first resin-encapsulating body 4, and affected only by stress applied at the time of resin molding of the second resin-encapsulating body 8. As compared to the conventional semiconductor device which uses a resin-encapsulating body of a batch encapsulation type, a semiconductor device with less variations in characteristics of the semiconductor element 6 can thus be obtained. Here, setting of a thickness of the second resin-encapsulating body 8 on the semiconductor element 6 to be thinner than a thickness of the first resin-encapsulating body 4 suppresses warping of the semiconductor element 6 more, and thus the variations in characteristics can be further suppressed.

Moreover, use of materials having the same thermal expansion coefficient for the second resin-encapsulating body 8 and the first resin-encapsulating body 4 can suppress displacement caused at an interface thereof, reduce the adverse effect of thermal stress and the stress applied on the semiconductor element, and suppress the variations in characteristics caused by cracks in the semiconductor element and the stress applied on the semiconductor element.

FIG. 3A to FIG. 7 are views for illustrating manufacturing steps of the semiconductor device according to the first embodiment of the present invention.

Figure 3A:
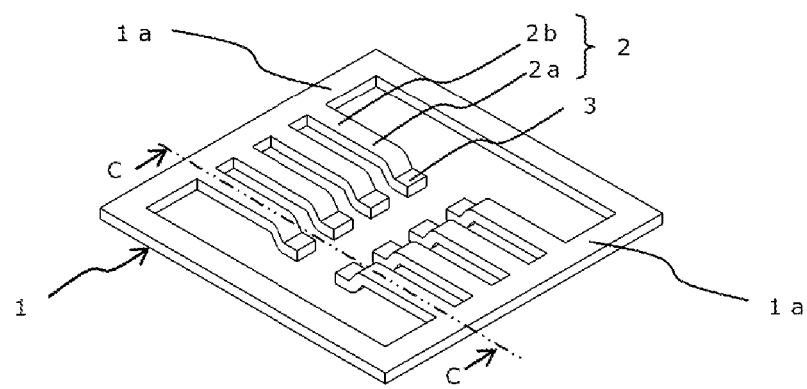
FIG. 3A and FIG. 3B are views for illustrating a manufacturing step of the semiconductor device according to the first embodiment of the present invention.
Figure 3B:
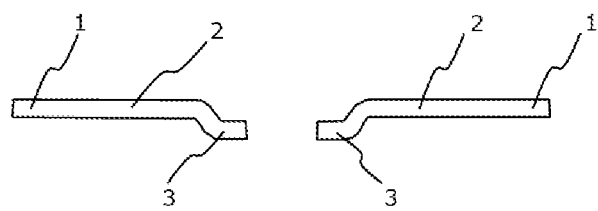

FIG. 3A and FIG. 3B are views for illustrating a lead frame used for the semiconductor device according to the first embodiment of the present invention. FIG. 3A is a bird's-eye view, and FIG. 3B is a cross-sectional view taken along the line—of FIG. 3A. A lead frame 1 includes a rectangular frame portion 1a which locates in the rim of the lead frame 1 and is made from four frame members and a plurality of leads 2 formed at inner sides of two frame members of the rectangular frame portion 1a. The leads 2 are connected respectively to two opposing frame members of the frame portion 1a and extend inward. Regions of the leads 2 that are close to the frame portion 1a are later formed to the outer leads 2b, and regions that are away from the frame portion 1a are later formed to the inner leads 2a.

First, the lead frame 1 is prepared from a flat plate by forming the frame portion 1a and the leads 2, and then the end portions 3 of a shape bending downward are formed in end regions of the inner leads 2a. At this time, the bending is performed such that the end portions 3 having the bending shape locate deeper (lower) than a thickness of the leads 2. Next, a plated silver film (not shown) is formed on a surface of each of the inner leads 2a. The plated silver film facilitates wire bonding which is performed later.

A lead frame is generally manufactured with the use of a stamping press mold, particularly, in case such a simple shape as that of the above-mentioned lead frame is employed, the stamping press mold will be inexpensive with a small number of parts which need to be manufactured since the number of punches and dies for punching the shape of the stamping press mold used for processing is small. Moreover, the number of steps of processing a shape of a stripper plate holding the punches reduces, to thereby result in a further inexpensive mold. In this manner, the lead frame used for the semiconductor device of the present invention allows manufacturing of an inexpensive lead frame by stamping press working with an inexpensive mold, with the result that a manufacturing cost of the semiconductor device of the present invention can be reduced, and that a semiconductor device that is more inexpensive than the conventional semiconductor device can be provided.

Figure 4A:
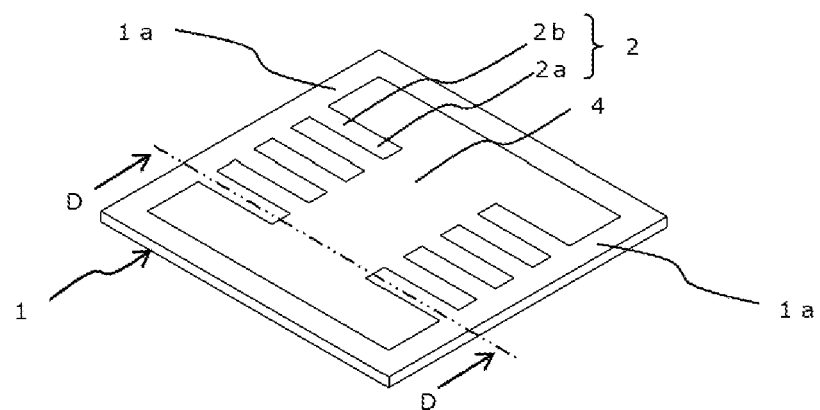
FIG. 4A and FIG. 4B are views for illustrating a manufacturing step following FIG. 3A and FIG. 3B of the semiconductor device according to the first embodiment of the present invention.
Figure 4B:
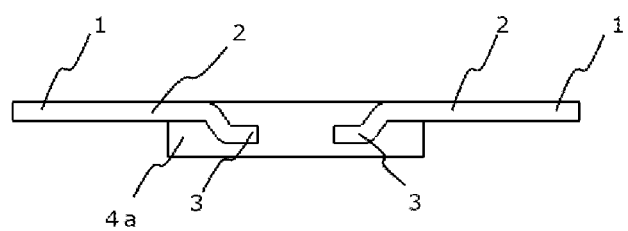

FIG. 4A and FIG. 4B are views for illustrating a state after the first resin-encapsulating body is formed in the lead frame 1. FIG. 4A is a bird's-eye view, and FIG. 4B is a cross-sectional view taken along the line D-D of FIG. 4A. Inside the frame portion 1a, an encapsulating resin is filled to form the first resin-encapsulating body 4. The upper surface of the first resin-encapsulating body 4 has a height equivalent to that of the frame portion 1a, and upper surfaces in regions without the shape bending downward of the leads 2 are flush with the upper surface of the first resin-encapsulating body 4. The leads 2 extending inward from two opposing frame members of the frame portion 1a are opposed to each other, the first resin-encapsulating body 4 whose surface forms the element mounting portion 11 is provided between the opposing leads 2. The upper mold used for the resin encapsulation at this time has therefore a flat shape.

Moreover, the end portions 3 of the leads 2 having the bending shape are covered with a convex region 4a of the first resin-encapsulating body 4, the convex region having a thickness at the same level as the thickness of the leads 2 is provided on bottom surfaces of the end portions 3 having the bending shape, and a bottom surface in a region without the bending shape of the leads 2 is flush with a bottom surface of the first resin-encapsulating body 4. The lower mold used for the resin encapsulation at this time therefore has a shape having a cavity corresponding to the convex region 4a in the center portion thereof.

Next, after forming the first resin-encapsulating body 4, first mold curing is performed. With this step, relaxation of the remaining stress in the resin is performed. Second mold curing is also performed in a later step, and in case the first mold curing is omitted to do with the second mold curing, the first resin-encapsulating body 4 is strained after the semiconductor element 6 is encapsulated. However, through the first mold curing after the first resin-encapsulating body 4 is performed, the strain in the first resin-encapsulating body 4 caused at the time of the second mold curing is small, and the variations in characteristics of the semiconductor element 6 can be suppressed. In case the resin used for forming the first resin-encapsulating body 4 is of a type that requires no curing, the above-mentioned first mold curing step is not required.

Figure 5A:
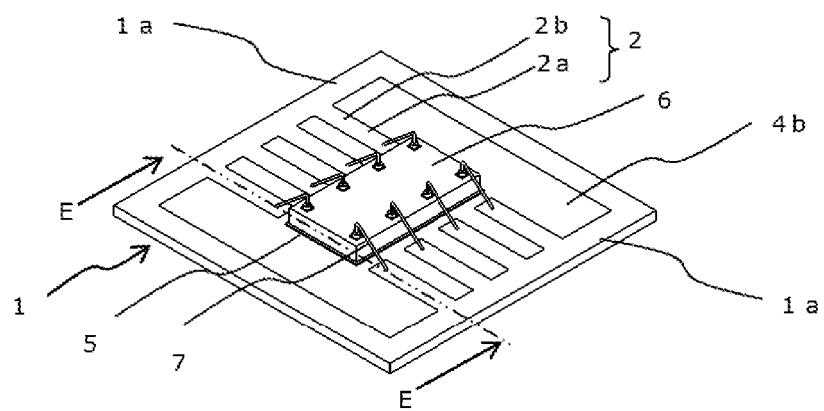
FIG. 5A and FIG. 5B are views for illustrating a manufacturing step following FIG. 4A and FIG. 4B of the semiconductor device according to the first embodiment of the present invention.
Figure 5B:
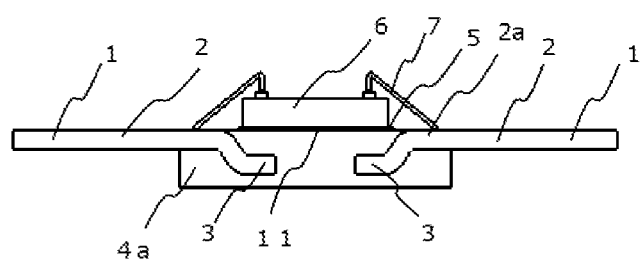

FIG. 5A and FIG. 5B are views for illustrating a state after wire bonding of the semiconductor device according to the first embodiment of the present invention. FIG. 5A is a bird's-eye view, and FIG. 5B is a cross-sectional view taken along the line E-E of FIG. 5A. On the element mounting portion 11 of the upper surface of the first resin-encapsulating body 4 formed inside the frame portion 1a, the semiconductor element 6 is bonded by a die attaching agent 5, and the semiconductor element 6 is electrically connected to the inner leads 2a formed in inner regions of the plurality of leads 2 extending from the frame portion 1a by the wires 7. Surfaces of the inner leads 2a bonded with the wires 7 have a height that is the same as the height of the frame portion 1a, and are located within the convex region 4a of the first resin-encapsulating body 4, as seen in plan view.

Figure 6A:
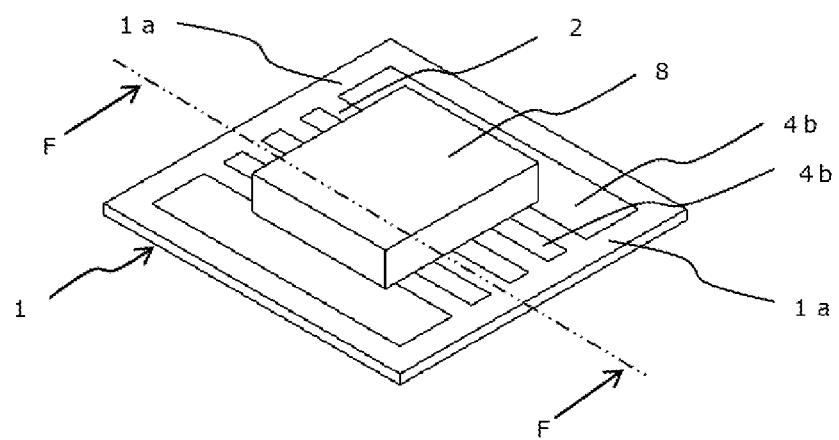
FIG. 6A and FIG. 6B are views for illustrating a manufacturing step following FIG. 5A and FIG. 5B of the semiconductor device according to the first embodiment of the present invention.
Figure 6B:
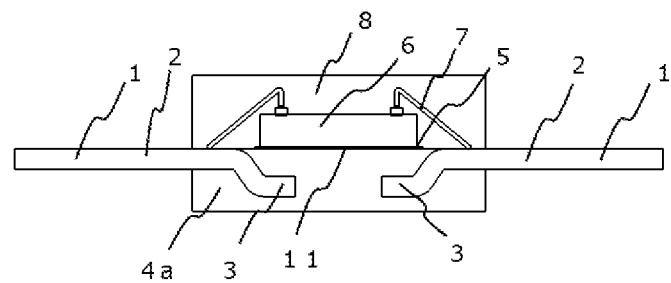

FIG. 6A and FIG. 6B are views for illustrating a state after the second resin-encapsulating body 8 of the semiconductor device according to the first embodiment of the present invention. FIG. 6A is a bird's-eye view, and FIG. 6B is a cross-sectional view taken along the line F-F of FIG. 6A. The second resin-encapsulating body 8 is formed to cover the upper surface of the first resin-encapsulating body 4, the semiconductor element 6, and the wires 7. The second resin-encapsulating body 8 is obtained by resin encapsulation with a material that is the same as the material of the first resin-encapsulating body 4. The second resin-encapsulated body 8 is formed to correspond to the convex region 4a on the bottom surface side of the first resin-encapsulating body 4, as seen in plan view. Thin regions of the first resin-encapsulating body 4 remain in regions other than the convex region 4a inside the frame portion 1a. In other words, thin regions of the first resin-encapsulating body 4 having a thickness that is the same as a thickness of the frame portion 1a remain between adjacent leads 2 and between the frame portion 1a and each of the leads 2. Next, the second mold curing is performed to carry out the relaxation of the remaining stress in the resin. If the resin used for forming the second resin-encapsulating body 8 is of a type that requires no curing, the above-mentioned second mold curing step is not required.

Figure 7:
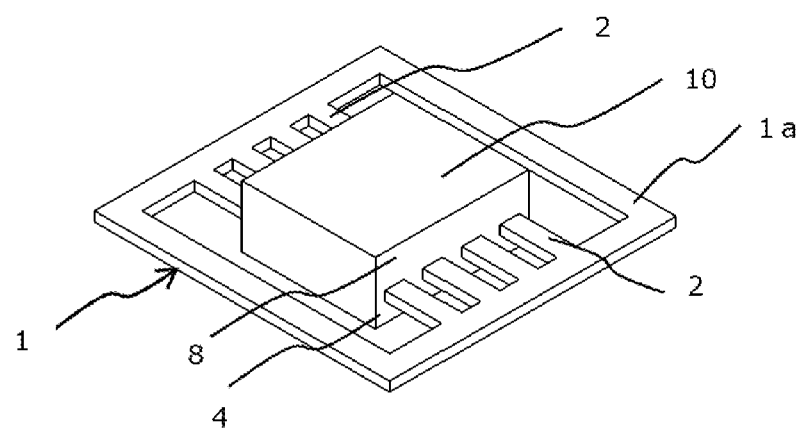
FIG. 7 is a view for illustrating a manufacturing step following FIG. 6A and FIG. 6B of the semiconductor device according to the first embodiment of the present invention.

FIG. 7 is a view for illustrating a state after unnecessary regions of the resin is removed after the second resin-encapsulating body of the semiconductor device according to the first embodiment of the present invention is formed. Thin regions 4b of the first resin-encapsulating body 4, that is, the first resin-encapsulating body 4 remaining between adjacent leads 2 and between the frame portion 1a and each of the leads 2 is removed, and the first resin-encapsulating body 4 has a shape that is the same as the shape of the second resin-encapsulating body 8, as seen in plan view, to form the integrated resin-encapsulating body 10. At this time, the resin between the leads 2 is also removed. The removal of the unnecessary regions of the encapsulating resin is performed through removal by punching or through laser processing.

Next, as illustrated in FIG. 1, distal ends of the leads 2 are bending downward to form the outer leads 2b. The outer leads 2b is subjected to bending to a height that allows mounting on the board, and the distal ends having the bending shape extend in the lateral direction.

Figure 8:
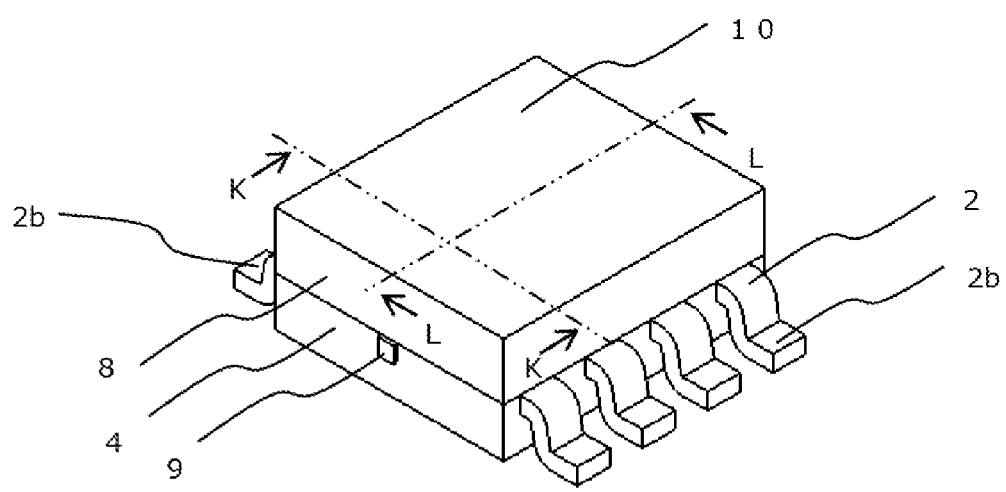
FIG. 8 is a bird's-eye view of a semiconductor device according to the second embodiment of the present invention.

FIG. 8 is a bird's-eye view of a semiconductor device according to the second embodiment of the present invention. A difference from the semiconductor device according to the first embodiment illustrated in FIG. 1 resides in that resin holding leads 9 are additionally provided. As illustrated in FIG. 8, the semiconductor device has a configuration in which a semiconductor element 6 is covered with a first resin-encapsulating body 4 and a second resin-encapsulating body 8 in which outer leads 2b which are part of leads 2 are exposed from the first resin-encapsulating body 4, and in which the resin holding leads 9 are further exposed from side surfaces adjacent to the two side surfaces from which the outer leads 2b are exposed. Upper surfaces of the leads 2 and the resin holding leads 9 are level with the upper surface of the first resin-encapsulating body 4, and are in contact with a lower surface of the second resin-encapsulating body.

Figure 9A:
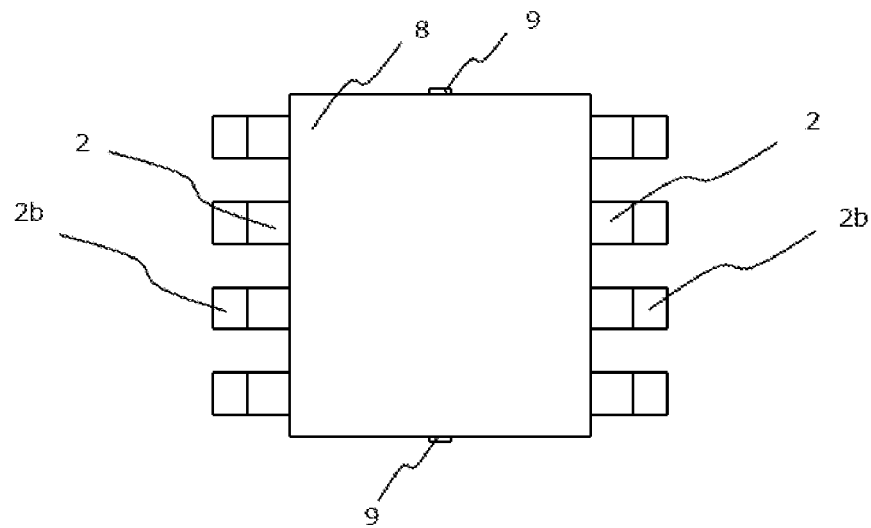
FIG. 9A, FIG. 9B, FIG. 9C, and FIG. 9D are views from respective directions of the semiconductor device according to the second embodiment of the present invention.
Figure 9B:
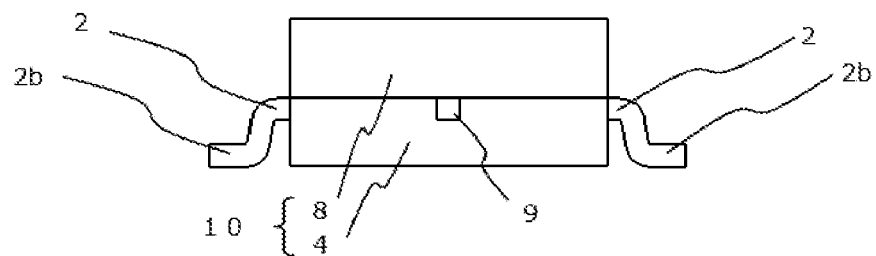

FIG. 9A to FIG. 9D are views from respective directions obtained from the bird's-eye view of FIG. 8. As illustrated in a top plan view of FIG. 9A, four outer leads 2b are provided to each of the opposing side surfaces of the semiconductor device, and the resin holding leads 9 are provided to the other two side surfaces. FIG. 9B is a side view from the resin holding lead side. The second resin-encapsulating body 8 is formed on the upper surface of the first resin-encapsulating body 4 with side surfaces of the first resin-encapsulating body 4 and the second resin-encapsulating body 8 are flush with each other.

Figure 9C:
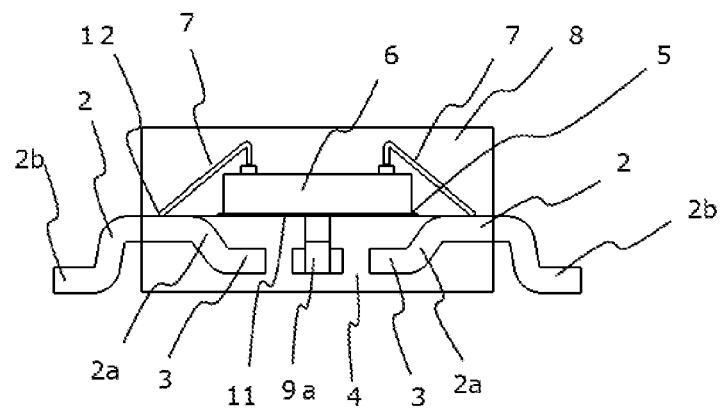

The outer leads 2b of the leads 2 are exposed from the first resin-encapsulating body 4, and the resin holding leads 9 are exposed from the side surfaces that are different from the side surfaces from which the outer leads 2b are exposed. The bottom surfaces of the bending outer leads 2b form mounting surfaces at the time of board mounting. FIG. 9C is a cross-sectional view taken along the line K-K of FIG. 8. Inner leads 2a of the leads 2 are covered with the first resin-encapsulating body 4, and the outer leads 2b are exposed from the first resin-encapsulating body 4, are then given a shape bending downward, and have distal ends having the bending shape extending in the lateral direction.

Each of the inner leads 2a embedded in the first resin-encapsulating body 4, but the surface of a portion of the inner lead 2a that is close to the outer lead 2b is exposed from the first resin-encapsulating body to join to one end of a wire 7 by a plated film in the exposed region. The inner leads 2a extend inward, and are then formed into a shape bending downward. Upper and lower surfaces of end portions 3 having the bending shape are covered with the first resin-encapsulating body 4 securing a sufficient thickness. End portions 9a of a bending shape of the resin holding leads 9 are embedded in the first resin-encapsulating body 4.

Figure 9D:
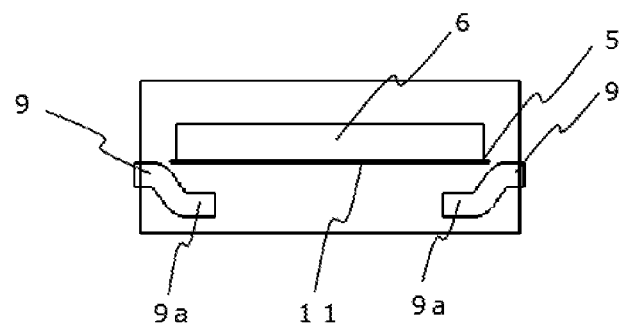

FIG. 9D is a cross-sectional view taken along the line L-L of FIG. 8. The resin holding leads 9 extend to the inside of the first resin-encapsulating body 4 to form the end portions 9a having the bending shape.

A surface region of the first resin-encapsulating body 4 that is above the end portions 3 having the bending shape of the inner leads 2a which are spaced apart and opposed, and above the end portions 9a having the bending shape of the resin holding leads 9 forms the element mounting portion 11, and a semiconductor element 6 is fixed thereto by a die attaching agent 5. The side surfaces of the first resin-encapsulating body 4 and the second resin-encapsulating body 8 are substantially flush with each other to form a resin-encapsulating body having substantially a rectangular parallelepiped shape.

Since the element mounting portion 11 of the semiconductor device described above is formed in a planar region of the upper surface of the first resin-encapsulating body 4, and since the end portions 3 having the bending shape of the inner leads 2a is provided below the element mounting portion 11, an area of contact between the inner leads 2a and the resin holding leads 9 with the first resin-encapsulating body 4 is very large to strengthen the close adhesion with each other. Moreover, in the conventional semiconductor device, in order to strengthen the close adhesion with each other, it has been required to provide large fixation regions between the inner leads and the resin-encapsulating body around the element mounting portion, which renders downsizing of the semiconductor device. With the structure of the present invention, a compact semiconductor device can be achieved.

Further, the semiconductor element 6 is placed on the planar region of the upper surface of the first resin-encapsulating body 4 after resin molding, and hence is not affected by stress applied at the time of resin molding of the first resin-encapsulating body 4, and affected only by stress applied at the time of resin molding of the second resin-encapsulating body 8. As compared to the conventional semiconductor device which employs a resin-encapsulating body of the batch encapsulation type, a semiconductor device with less variations in characteristics of the semiconductor element 6 can thus be obtained. Here, setting of a thickness of the second resin-encapsulating body 8 to be thinner than a thickness of the first resin-encapsulating body 4 suppresses warpage of the semiconductor element 6 more, and the variations in characteristics can further be suppressed.

FIG. 10A to FIG. 15B are views for illustrating manufacturing steps of the semiconductor device according to the second embodiment of the present invention.

Figure 10A:
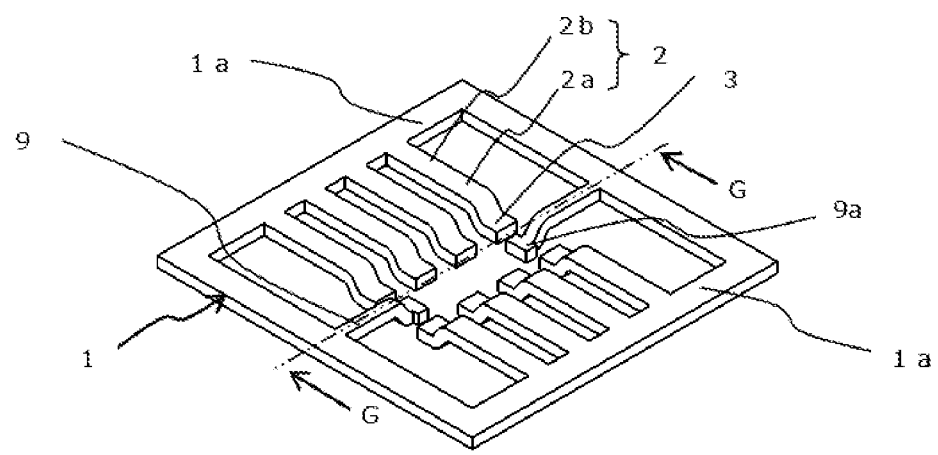
FIG. 10A and FIG. 10B are views for illustrating a manufacturing step of the semiconductor device according to the second embodiment of the present invention.
Figure 10B:
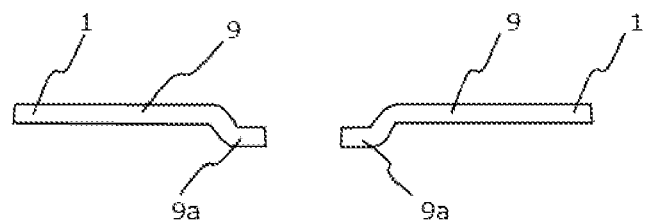

FIG. 10A and FIG. 10B are views for illustrating a lead frame used for the semiconductor device according to the second embodiment of the present invention. FIG. 10A is a bird's-eye view, and FIG. 10B is a cross-sectional view taken along the line G-G of FIG. 10A. A lead frame 1 includes a frame portion 1a which locates in the outer periphery of the lead frame 1, a plurality of leads 2 formed at inner sides of two frame members of the frame portion 1a, and the resin holding leads 9 formed at inner sides of the other two frame members adjacent to the above-mentioned two frame members. The leads 2 are connected respectively to two opposing frame members of the frame portion 1*a*, the resin holding leads 9 are connected respectively to the other two frame members adjacent to the two frame members, and the leads 2 and the resin holding leads 9 extend inward. Regions of the leads 2 that are close to the frame portion 1*a* are later formed to the outer leads 2*b*, and regions that are away from the frame portion 1*a* are later formed to the inner leads 2*a*.

First, the lead frame 1 is prepared from a flat plate by forming the frame portion 1*a*, the leads 2, and the resin holding leads 9, then the end portions 3 of a shape bending downward are formed in end regions of the inner leads 2*a*, and the end portions 9*a* having the shape bending downward are formed in the end regions of the resin holding leads 9. At this time, the bending is performed so that the end portions 3 having the bending shape of the inner leads 2*a* and the end portions 9*a* having the bending shape of the resin holding leads locate deeper (lower) than a thickness of the leads 2. Next, a plated silver film (not shown) is formed on a surface of each of the inner leads 2*a*. The plated silver film facilitates wire bonding which is performed later.

A lead frame is generally manufactured with the use of a stamping press mold, particularly, in case such a simple shape as that of the above-mentioned lead frame is employed, the stamping press mold will be inexpensive with a small number of parts which need to be manufactured since the number of punches and dies for punching the shape of the stamping press mold used for processing is small. Moreover, the number of steps of processing a shape of a stripper plate holding the punches is reduced, to thereby result in a further inexpensive mold. In this manner, the lead frame used for the semiconductor device of the present invention allows manufacturing of an inexpensive lead frame by stamping press working with an inexpensive mold, with the result that a manufacturing cost of the semiconductor device of the present invention can be reduced, and that a semiconductor device that is more inexpensive than the conventional semiconductor device.

Figure 11A:
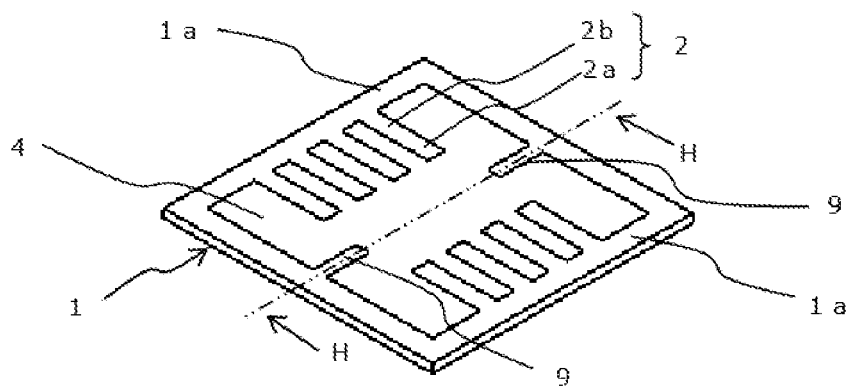
FIG. 11A and FIG. 11B are views for illustrating a manufacturing step following FIG. 10A and FIG. 10B of the semiconductor device according to the second embodiment of the present invention.
Figure 11B:
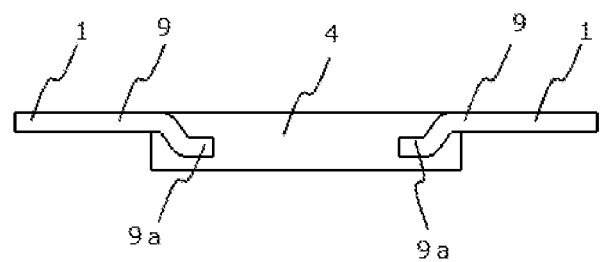

FIG. 11A and FIG. 11B are views for illustrating a state after the first resin-encapsulating body is formed in the lead frame 1. FIG. 11A is a bird's-eye view, and FIG. 11B is a cross-sectional view taken along the line H-H of FIG. 11A. Inside the frame portion 1*a*, an encapsulating resin is filled to form the first resin-encapsulating body 4. The upper surface of the first resin-encapsulating body 4 has a height equivalent to that of the frame portion 1*a*, and upper surfaces in regions without the shape bending downward of the leads 2 and resin holding leads 9 are flush with the upper surface of the first resin-encapsulating body 4. The leads 2 extending inward from two opposing frame members of the frame portion 1*a* are opposed to each other, the first resin-encapsulating body 4 whose surface forms the element mounting portion 11 is provided between the opposing leads 2. The upper mold used for the resin encapsulation at this time has therefore a flat shape.

Moreover, the end portions 3 having the bending shape of the leads 2 and the end portions 9 of the resin holding leads 9 are covered with a convex region 4*a* of the first resin-encapsulating body 4, the convex region 4*a* having a thickness at the same level as the thickness of the leads 2 is provided on bottom surfaces of the end portions 3 having the bending shape, and a bottom surface in a region without the bending shape of the leads 2 is flush with a bottom surface of the first resin-encapsulating body 4. The lower mold used for the resin encapsulation at this time has therefore a shape having a cavity corresponding to the convex region 4*a* in a center portion thereof.

After forming the first resin-encapsulating body 4, first mold curing is performed. With this step, the relaxation of the remaining stress in the resin is performed. Second mold curing is also performed in a later step, and when the first mold curing is omitted to do with the second mold curing, the first resin-encapsulating body 4 is strained after the semiconductor element 6 is encapsulated. However, through performing the first mold curing after the first resin-encapsulating body 4 is performed, the strain in the first resin-encapsulating body 4 caused at the time of the second mold curing is small, and the variations in characteristics of the semiconductor element 6 can be suppressed. In case the resin used for forming the first resin-encapsulating body 4 is of a type that requires no curing, the above-mentioned first mold curing step is not required.

Figure 12:
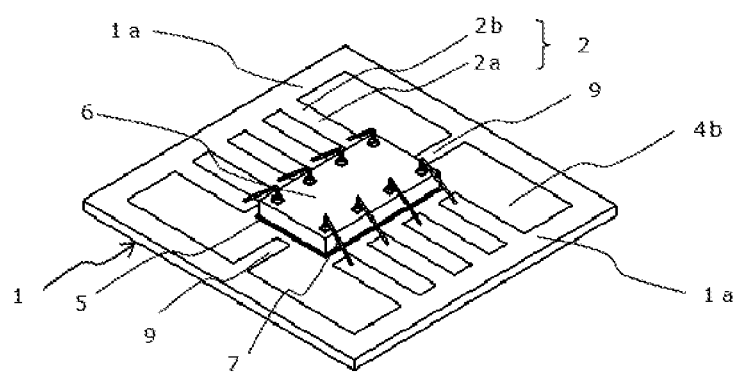
FIG. 12 is a bird's-eye view for illustrating a state after assembly following FIG. 11A and FIG. 11B of the semiconductor device according to the second embodiment of the present invention.

FIG. 12 is a bird's-eye view for illustrating a state after wire bonding of the semiconductor device according to the second embodiment of the present invention. On the element mounting portion 11 of the upper surface of the first resin-encapsulating body 4 formed inside the frame portion 1*a*, the semiconductor element 6 is bonded by a die attaching agent 5, and the semiconductor element 6 electrically connect to the inner leads 2*a* formed in inner regions of the plurality of leads 2 extending from the frame portion 1*a* by the wires 7.

Figure 13:
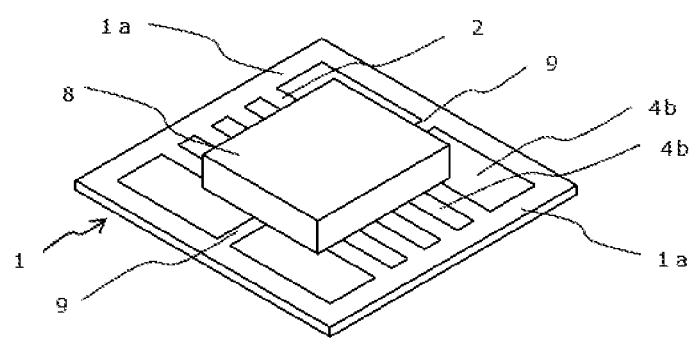
FIG. 13 is a view for illustrating a manufacturing step following FIG. 12 of the semiconductor device according to the second embodiment of the present invention.

FIG. 13 is a bird's-eye view for illustrating a state after the second resin-encapsulating body of the semiconductor device according to the first embodiment of the present invention. The second resin-encapsulating body 8 is formed to cover the upper surface of the first resin-encapsulating body 4, the semiconductor element 6, and the wires 7. The second resin-encapsulating body 8 is obtained by resin encapsulation with a material that is the same as the material of the first resin-encapsulating body 4. The second resin-encapsulating body 8 is formed to correspond to the convex region 4*a* on the bottom surface side of the first resin-encapsulating body 4, as seen in plan view. Thin regions of the first resin-encapsulating body 4 remain in regions other than the convex region 4*a* inside the frame portion 1*a*. In other words, thin regions of the first resin-encapsulating body 4 having a thickness that is the same as a thickness of the frame portion 1*a* remain between adjacent leads 2 and between the frame portion 1*a* and each of the leads 2. Next, the second mold curing is performed to carry out the relaxation of the remaining stress in the resin. If the resin used for forming the second resin-encapsulating body 8 is of a type that requires no curing, the above-mentioned second mold curing step is not required.

Figure 14:
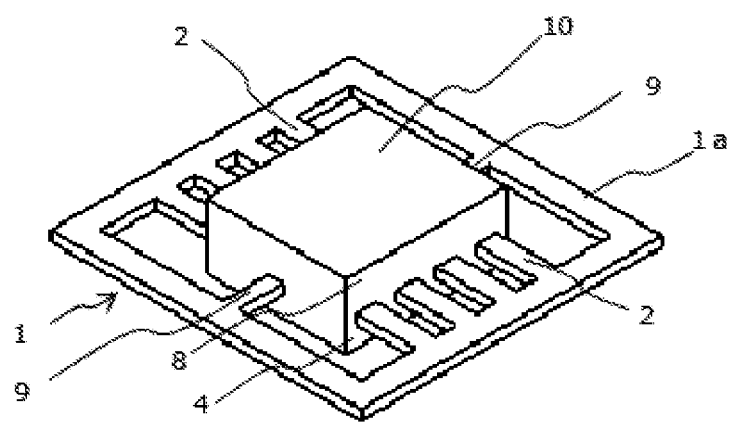
FIG. 14 is a view for illustrating a manufacturing step following FIG. 13 of the semiconductor device according to the second embodiment of the present invention.

FIG. 14 is a view for illustrating a state after unnecessary regions of the resin is removed after the second resin encapsulation of the semiconductor device according to the second embodiment of the present invention. Thin regions 4*b* of the first resin-encapsulating body 4, the first resin-encapsulating body 4 remaining between adjacent leads 2 and between the frame portion 1*a* and each of the leads 2 is removed, and the first resin-encapsulating body 4 has a shape that is the same as the shape of the second resin-encapsulating body 8, as seen in plan view to form the integrated resin-encapsulating body 10. At this time, the resin between the leads 2 is also removed. The removal of the unnecessary regions of the encapsulating resin is performed through removal by punching or through laser processing.

Figure 15A:
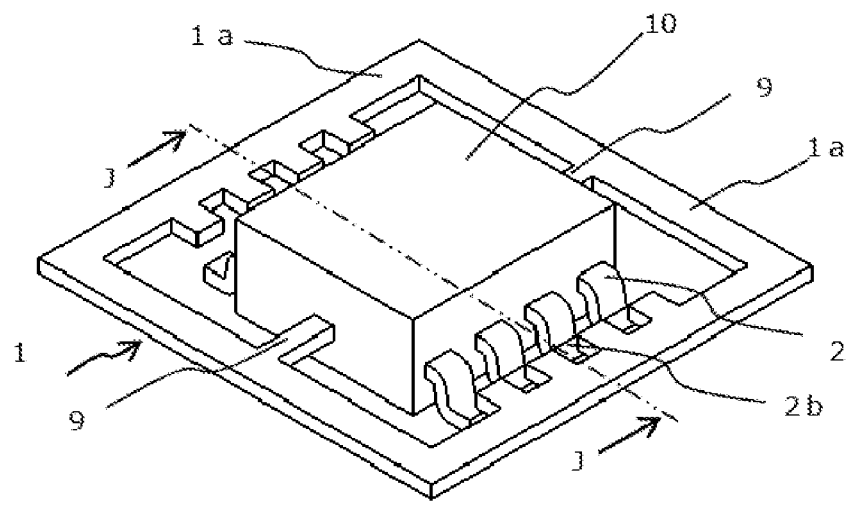
FIG. 15A and FIG. 15B are views for illustrating a manufacturing step following FIG. 14 of the semiconductor device according to the second embodiment of the present invention.
Figure 15B:
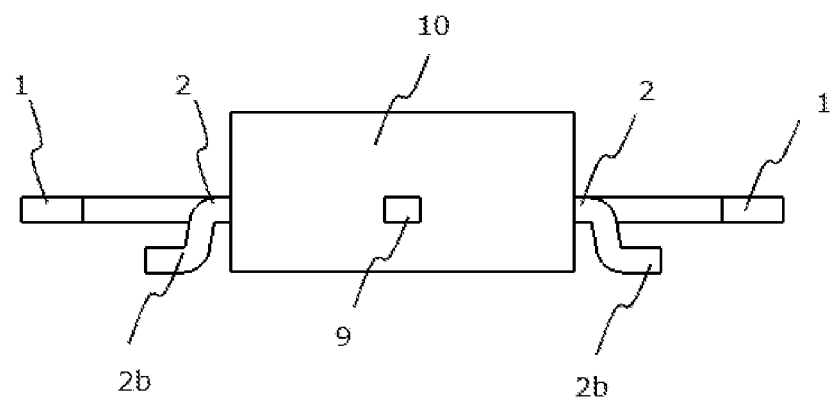
Figure 16A:
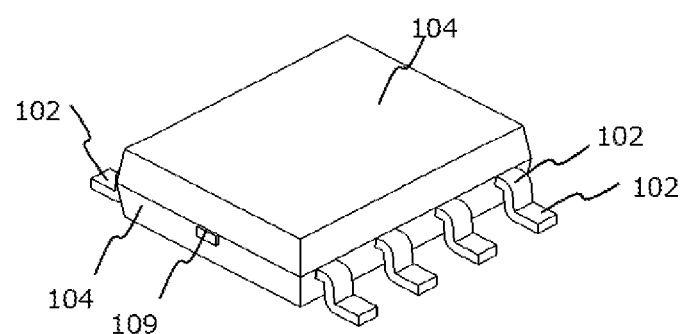
FIG. 16A, FIG. 16B, FIG. 16C, and FIG. 16D are views for illustrating a conventional semiconductor device.
Figure 16B:
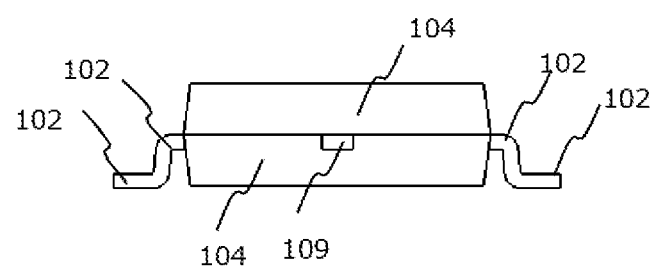
Figure 16C:
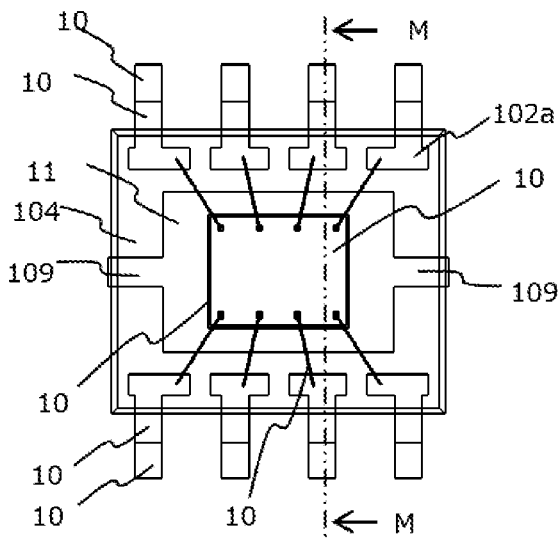
Figure 16D:
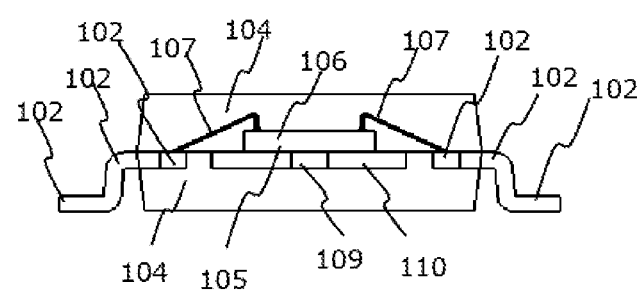

FIG. 15A and FIG. 15B are views for illustrating a state in which the outer leads of the semiconductor device according to the second embodiment of the present invention are cut and formed into the bending shape. FIG. 15A is a bird's-eye view, and FIG. 15B is a cross-sectional view taken along the line J-J of FIG. 15A. First, the leads 2 are cut away from the frame portion 1a. Then, the distal ends of the leads 2 exposed from the integrated resin-encapsulating body 10 which is formed of the first resin-encapsulating body 4 and the second resin-encapsulating body are bending downward to form the outer leads 2b. The outer leads 2b are subjected to bending to a height that allows mounting on the board. At this time, the resin holding leads 9 are in a state of being connected to the frame portion 1a. Electroplating is performed with the use of the frame portion 1a under this state, a plated film is formed on cut surfaces of the outer leads 2b to facilitate mounting in the subsequent step. Next, an electrical characteristics test is performed on the semiconductor device in this form. Semiconductor devices are embedded in lead frames 1 arranged in matrix by the resin holding leads 9, and hence the electrical characteristics test can be performed efficiently. After completing the electrical characteristic test, the resin holding leads 9 are cut away from the frame portion 1a. Cutting the resin holding leads 9 at portions which are exposed from the side surfaces of the integrated resin-encapsulating body 10 is desired.

According to the method of manufacturing the semiconductor device described above, not only a compact semiconductor device can be obtained, but also the electrical characteristics test can be performed efficiently. As a result, the manufacturing cost of the semiconductor device can be reduced, and an inexpensive semiconductor device can be provided.

What is claimed is:

1. A semiconductor device, comprising:
   a first resin-encapsulating body;
   a semiconductor element in contact with and attached to a surface of the first resin-encapsulating body;
   inner leads around the semiconductor element, and electrically connected to the semiconductor element;
   outer leads extending from the inner leads; and
   a second resin-encapsulating body covering an upper surface of the first resin-encapsulating body and the semiconductor element,
   wherein the inner leads are covered by the first resin-encapsulating body, and
   upper surfaces of end portions of the inner leads are vertically below and spaced apart from the semiconductor element; and
   wherein the first resin-encapsulating body includes a convex region and the end portions of the inner leads are covered by the convex region and the semiconductor element is attached to the convex region.

2. The semiconductor device according to claim 1, wherein the end portions of the inner leads have a bent shape.

3. The semiconductor device according to claim 1, wherein a portion of the inner leads are partially exposed by the first resin-encapsulating body and the portion is in contact with the second resin-encapsulating body.

4. The semiconductor device according to claim 2, wherein a portion of the inner leads are partially exposed by the first resin-encapsulating body and the portion is in contact with the second resin-encapsulating body.

5. The semiconductor device according to claim 1, wherein the inner leads are at two opposing side surfaces of the first resin-encapsulating body, and resin-holding leads reside at side surfaces adjacent to the two opposing side surfaces.

6. The semiconductor device according to claim 2, wherein the inner leads are at two opposing side surfaces of the first resin-encapsulating body, and resin-holding leads reside at side surfaces adjacent to the two opposing side surfaces.

7. The semiconductor device according to claim 3, wherein the inner leads are at two opposing side surfaces of the first resin-encapsulating body, and resin-holding leads reside at side surfaces adjacent to the two opposing side surfaces.

8. The semiconductor device according to claim 4, wherein the inner leads are at two opposing side surfaces of the first resin-encapsulating body, and resin-holding leads reside at side surfaces adjacent to the two opposing side surfaces.

9. The semiconductor device according to claim 5, wherein end portions of the resin-holding leads have a bent shape.

10. The semiconductor device according to claim 6, wherein end portions of the resin-holding leads have a bent shape.

11. The semiconductor device according to claim 7, wherein end portions of the resin-holding leads have a bent shape.

12. The semiconductor device according to claim 8, wherein end portions of the resin-holding leads have a bent shape.

13. The semiconductor device according to claim 1, wherein a thickness of the second resin-encapsulating body on the semiconductor element is thinner than a thickness of the first resin-encapsulating body.

14. The semiconductor device according to claim 2, wherein a thickness of the second resin-encapsulating body on the semiconductor element is thinner than a thickness of the first resin-encapsulating body.

15. The semiconductor device according to claim 3, wherein a thickness of the second resin-encapsulating body on the semiconductor element is thinner than a thickness of the first resin-encapsulating body.

16. The semiconductor device according to claim 4, wherein a thickness of the second resin-encapsulating body on the semiconductor element is thinner than a thickness of the first resin-encapsulating body.

* * * * *